(12) United States Patent
Peng et al.

(10) Patent No.: US 11,929,112 B2
(45) Date of Patent: Mar. 12, 2024

(54) SENSE AMPLIFIER, MEMORY, AND METHOD FOR CONTROLLING SENSE AMPLIFIER

(71) Applicants: ANHUI UNIVERSITY, Anhui (CN); CHANGXIN MEMORY TECHNOLOGIES, INC., Hefei (CN)

(72) Inventors: Chunyu Peng, Hefei (CN); Zijian Wang, Hefei (CN); Wenjuan Lu, Hefei (CN); Xiulong Wu, Hefei (CN); Jun He, Hefei (CN); Xin Li, Hefei (CN); Zhan Ying, Hefei (CN); Kanyu Cao, Hefei (CN); Zhiting Lin, Hefei (CN); Junning Chen, Hefei (CN)

(73) Assignees: ANHUI UNIVERSITY, Hefei (CN); CHANGXIN MEMORY TECHNOLOGIES, INC., Hefei (CN)

( * ) Notice: Subject to any disclaimer, the term of this patent is extended or adjusted under 35 U.S.C. 154(b) by 236 days.

(21) Appl. No.: 17/472,792

(22) Filed: Sep. 13, 2021

(65) Prior Publication Data
US 2022/0028446 A1 Jan. 27, 2022

Related U.S. Application Data

(63) Continuation of application No. PCT/CN2020/139624, filed on Dec. 25, 2020.

(30) Foreign Application Priority Data

Jul. 27, 2020 (CN) .......................... 202010733146.2

(51) Int. Cl.
*G11C 11/4091* (2006.01)
*G11C 5/06* (2006.01)
(Continued)

(52) U.S. Cl.
CPC ............ *G11C 11/4091* (2013.01); *G11C 5/06* (2013.01); *G11C 11/4094* (2013.01); *G11C 11/4096* (2013.01); *G11C 11/4099* (2013.01)

(58) Field of Classification Search
CPC ... G11C 11/4091; G11C 5/06; G11C 11/4094; G11C 11/4096; G11C 11/4099
(Continued)

(56) References Cited

U.S. PATENT DOCUMENTS

| 5,226,014 A | 7/1993 | McManus |
| 6,400,629 B1 | 6/2002 | Barth, Jr. |

(Continued)

FOREIGN PATENT DOCUMENTS

| CN | 1450564 A | 10/2003 |
| CN | 101221814 A | 7/2008 |

(Continued)

OTHER PUBLICATIONS

International Search Report in the international application No. PCT/CN2020/139624, dated Apr. 27, 2021, 2 pgs.
(Continued)

*Primary Examiner* — Huan Hoang
(74) *Attorney, Agent, or Firm* — Cooper Legal Group, LLC (57) ABSTRACT

The sense amplifier includes: an amplification module configured to amplify a voltage transmitted by a bit line or a reference bit line, when the sense amplifier is at an amplification stage; a first switch module configured to control the amplification module to be disconnected from the reference bit line, when the sense amplifier performs a read operation for the bit line and is at the amplification stage. In the disclosure, the power consumption of the sense amplifier may be reduced.

19 Claims, 6 Drawing Sheets

(51) Int. Cl.
  *G11C 11/4094* (2006.01)
  *G11C 11/4096* (2006.01)
  *G11C 11/4099* (2006.01)

(58) Field of Classification Search
  USPC .................................................. 365/185.21
  See application file for complete search history.

(56) References Cited

U.S. PATENT DOCUMENTS

| | | | |
|---|---|---|---|
| 11,315,610 B1* | 4/2022 | Peng | G11C 7/065 |
| 2004/0032759 A1 | 2/2004 | Chow | |
| 2010/0315858 A1 | 12/2010 | Lynch | |
| 2011/0080796 A1* | 4/2011 | Bruennert | G11C 11/4091 |
| | | | 365/205 |
| 2011/0305098 A1 | 12/2011 | Choi | |
| 2014/0192603 A1 | 7/2014 | Singh | |
| 2017/0243636 A1 | 8/2017 | Wang | |

FOREIGN PATENT DOCUMENTS

| | | | |
|---|---|---|---|
| CN | 102543146 A | 7/2012 |
| CN | 102592650 A | 7/2012 |
| CN | 106469567 A | 3/2017 |
| CN | 107103922 A | 8/2017 |
| CN | 109817263 A | 5/2019 |
| CN | 110610730 A | 12/2019 |
| CN | 210156119 U | 3/2020 |
| CN | 111145799 A | 5/2020 |
| CN | 111863051 A | 10/2020 |
| JP | 2003187573 A | 7/2003 |

OTHER PUBLICATIONS

"The Circuit Design and Implementation of the Sense Amplifier in Nano-Crystal Memory", Jun. 2012, Wang Fenghu, Chinese Excellent Master's dissertations • Full-text Database • Information Technology, vol. 6, 114 pgs.

"First Demonstration of In-Line Phase Sensitive Amplifier Based on PPLN Waveguide", Dec. 2012, Takeshi Umeki, Hirokazu Takenouchi and Masaki Asobe, 38th European Conference and Exhibition on Optical Communications, 3 pgs.

First Office Action of the Chinese application No. 202010733146.2, dated May 18, 2022, 16 pgs.

English translation of the Written Opinion of the International Search Authority in the international application No. PCT/CN2020/139624, dated Apr. 27, 2021. 4 pages.

English translation of the Written Opinion of the International Search Authority in the international application No. PCT/CN2020/139315, dated Apr. 26, 2021. 4 pages.

International Search Report in the international application No. PCT/CN2020/139315, dated Apr. 26, 2021. 2 pages.

Zhang Li, Yao Rong and Fang Huan, "Research and Design of Tolerance Deviation Sensitive Amplifier", Computer & Digital Engineering, vol. 47, No. 11, Nov. 2019, 4 pages.

First Office Action of the Chinese application No. 202010733096.8, dated May 10, 2022. 12 pages with English translation.

Sherif M. Sharrough, "Low-Power and High-Speed DRAM Readout Scheme" IEEE 20th International Conference on Electronics, Circuits, and Systems (ICECS), 2013, 4 pages.

Notice of Allowance of the U.S. Appl. No. 17/441,676, dated Feb. 15, 2022. 25 pages.

Correction of Notice of Allowance of the U.S. Appl. No. 17/441,676, dated Feb. 17, 2022. 6 pages.

Correction of Notice of Allowance of the U.S. Appl. No. 17/441,676, dated Apr. 4, 2022. 4 pages.

* cited by examiner

SENSE AMPLIFIER, MEMORY, AND METHOD FOR CONTROLLING SENSE AMPLIFIER

CROSS-REFERENCE TO RELATED APPLICATIONS

This is a continuation application of International Patent Application No. PCT/CN2020/139624, filed on Dec. 25, 2020, which claims priority to Chinese Patent Application No. 202010733146.2, filed on Jul. 27, 2020 and entitled "SENSE AMPLIFIER, MEMORY, AND METHOD FOR CONTROLLING SENSE AMPLIFIER". The disclosures of International Patent Application No. PCT/CN2020/139624 and Chinese Patent Application No. 202010733146.2 are incorporated by reference herein in their entireties.

TECHNICAL FIELD

The disclosure relates to the technical field of a semiconductor memory, in particular to a sense amplifier, a memory, and a method for controlling a sense amplifier.

BACKGROUND

With the popularization of electronic devices such as mobile phones, tablet computers, personal computers, etc., technology of a semiconductor memory also has been developed rapidly. Memories such as Dynamic Random Access Memory (DRAM) and Static Random-Access Memory (SRAM) have been widely used in various electronic devices due to their advantages of high density, low power consumption, low price, etc.

A Sense Amplifier (simply referred to as SA) is an important component of the semiconductor memory, and its main function is to amplify a small signal on a bit line, so as to perform a read operation or a write operation.

As an important index for evaluating the performance of the sense amplifier, power consumption directly affects the application scenario of the memory. At present, how to reduce the power consumption of the sense amplifier has become an urgent problem to be solved.

It should be noted that the above information disclosed in the Background section is only for enhancement of understanding of the background of the disclosure, and therefore it may contain information that does not constitute the related art that is already known to a person of ordinary skill in the art.

SUMMARY

An object of the disclosure is to provide a sense amplifier, a memory, and a method for controlling a sense amplifier, thereby overcoming, at least to some extent, the problem that the power consumption of the sense amplifier is relative high due to limitations and defects of the related art.

According to a first aspect of the disclosure, there is provided a sense amplifier, which includes: an amplification module configured to amplify a voltage transmitted by a bit line or a reference bit line, when the sense amplifier is at an amplification stage; and a first switch module configured to control the amplification module to be disconnected from the reference bit line, when the sense amplifier performs a read operation on the bit line and the sense amplifier is at the amplification stage.

In an embodiment, the first switch module is configured to control the amplification module to be disconnected from the reference bit line based on a data source control signal, when the sense amplifier is at the amplification stage.

In an embodiment, the first switch module includes a first switch unit. A first control terminal of the first switch unit is configured to receive the data source control signal, a first terminal of the first switch unit is connected to the amplification module through a first node, and a second terminal of the first switch unit is connected to the reference bit line.

In an embodiment, the first switch module configured to control the amplification module to be disconnected from the reference bit line based on the data source control signal is configured to: control the amplification module to be disconnected from the reference bit line in response to the data source control signal and a first control signal. Herein, the first switch unit further includes a second control terminal configured to receive the first control signal.

In an embodiment, the sense amplifier further includes a second switch module configured to control the amplification module to be disconnected from the bit line, when the sense amplifier performs a read operation on the reference bit line and the sense amplifier is at the amplification stage.

In an embodiment, the second switch module includes: an inverter, an input terminal of the inverter being configured to receive a data source control signal; and a second switch unit, a first control terminal of the second switch unit being connected to an output terminal of the inverter, a first terminal of the second switch unit being connected to the amplification module through a second node, and a second terminal of the second switch unit being connected to the bit line.

In an embodiment, the second switch unit further includes a second control terminal configured to receive a first control signal.

In an embodiment, the sense amplifier further includes a discharge control module configured to discharge the sense amplifier after the sense amplifier performs a read '1' operation on the bit line.

In an embodiment, the amplification module includes: a first positive channel Metal Oxide Semiconductor (PMOS) transistor, a drain of the first PMOS transistor being connected to a first node; a first negative channel Metal Oxide Semiconductor (NMOS) transistor, a drain of the first NMOS transistor being connected to the first node and a gate of the first NMOS transistor being connected to a gate of the first PMOS transistor; a second PMOS transistor, a drain of the second PMOS transistor being connected to a second node; a second NMOS transistor, a drain of the second NMOS transistor being connected to the second node, and a gate of the second NMOS transistor being connected to a gate of the second PMOS transistor; a third PMOS transistor, a drain of the third PMOS transistor being connected to a source of the first PMOS transistor and a source of the second PMOS transistor, a gate of the third PMOS transistor being configured to receive a second control signal, and a source of the third PMOS transistor being configured to receive a supply voltage; and a third NMOS transistor, a drain of the third NMOS transistor being connected to a source of the first NMOS transistor and a source of the second NMOS transistor, a gate of the third NMOS transistor being configured to receive a first control signal, and a source of the third NMOS transistor being grounded. Herein, the gate of the first PMOS transistor is connected to the second node, and the gate of the second PMOS transistor is connected to the first node.

In an embodiment, the discharge control module includes: a first discharge unit configured to connect the gate of the first NMOS transistor to the first node in response to a discharge control signal; and a second discharge unit configured to connect the gate of the second NMOS transistor to the second node in response to a discharge control signal.

In an embodiment, the first switch unit includes a fourth negative channel Metal Oxide Semiconductor (NMOS) transistor, a gate of the fourth NMOS transistor being configured to receive the data source control signal, a source of the fourth NMOS transistor being connected to the reference bit line, and a drain of the fourth NMOS transistor being connected to the first node.

In an embodiment, the first switch unit includes: a fourth negative channel Metal Oxide Semiconductor (NMOS) transistor, a gate of the fourth NMOS transistor being configured to receive the data source control signal, a source of the fourth NMOS transistor being connected to the reference bit line, and a drain of the fourth NMOS transistor being connected to the first node; and a fourth positive channel Metal Oxide Semiconductor (PMOS) transistor, a gate of the fourth PMOS transistor being configured to receive the first control signal, a drain of the fourth PMOS transistor being connected to the reference bit line, and a source of the fourth PMOS transistor being connected to the first node.

In an embodiment, the second switch unit includes a fifth negative channel Metal Oxide Semiconductor (NMOS) transistor, a gate of the fifth NMOS transistor being connected to the output terminal of the inverter, a drain of the fifth NMOS transistor being connected to the bit line, and a source of the fifth NMOS transistor being connected to the second node.

In an embodiment, the second switch unit includes: a fifth negative channel Metal Oxide Semiconductor (NMOS) transistor, a gate of the fifth NMOS transistor being connected to the output terminal of the inverter, a drain of the fifth NMOS transistor being connected to the bit line, and a source of the fifth NMOS transistor being connected to the second node; and a fifth positive channel Metal Oxide Semiconductor (PMOS) transistor, a gate of the fifth PMOS transistor being configured to receive the first control signal, a source of the fifth PMOS transistor being connected to the bit line, and a drain of the fifth PMOS transistor being connected to the second node.

In an embodiment, the sense amplifier further includes a precharge module configured to precharge the bit line and the reference bit line when the sense amplifier is at a precharge stage.

According to a second aspect of the disclosure, there is provided a memory, which includes the sense amplifier of any one of the above embodiments.

According to a third aspect of the disclosure, there is provided a method for controlling a sense amplifier. The method for controlling a sense amplifier includes the following operation. An amplification module is controlled to be disconnected from a reference bit line, when the sense amplifier performs a read operation on a bit line and the sense amplifier is at an amplification stage.

In the technical solutions provided by some embodiments of the disclosure, the first switch module is configured to control the amplification module to be disconnected from the reference bit line, when the sense amplifier performs a read operation on the bit line and the sense amplifier is at the amplification stage. Therefore, when the read operation is performed on the bit line, the power consumption of the sense amplifier is greatly reduced. Furthermore, since amplification of the voltage on the reference bit line is not performed in the solution of the disclosure when the read operation is performed on the bit line, the signal processing speed of the circuit is improved.

It should be understood that the foregoing general description and the detailed description below are merely exemplary and explanatory, and do not limit the disclosure.

BRIEF DESCRIPTION OF THE DRAWINGS

The accompanying drawings herein are incorporated in and constitute a part of this specification, illustrate embodiments conforming to the disclosure, and, together with the description, serve to explain the principles of the disclosure. Apparently, the accompanying drawings in the following description show merely some embodiments of the disclosure, and persons of ordinary skill in the art may still derive other drawings from these accompanying drawings without creative efforts, in which.

DETAILED DESCRIPTION

The exemplary embodiment will now be described more fully with reference to the accompanying drawings. However, the exemplary embodiments may be implemented in various forms and should not be construed as being limited to the examples set forth herein. Rather, the embodiments are provided so that the disclosure will be thorough and complete, and the concepts of the exemplary embodiments will be conveyed fully to those skilled in the art. The described features, structures or characteristics may be combined in one or more embodiments in any suitable manner. In the following description, numerous specific details are provided to give a thorough understanding of the embodiments of the disclosure. However, those skilled in the art will realize that the technical solutions of the disclosure may be practiced without one or more of the specific details, or other methods, components, devices, steps, or the like may be adopted. In other cases, well-known technical solutions have not been illustrated or described in detail to avoid obscuring aspects of the disclosure.

Furthermore, the drawings are merely schematic illustrations of the disclosure and are not necessarily drawn to scale. The same reference numerals in the drawings represent the same or similar parts, and thus repeated descriptions thereof will be omitted. The descriptions of "first", "second", "third", "fourth" and "fifth" are only intended to distinguish there-between, and should not be used to limit the disclosure.

It should be noted that the term "connect" as used in the disclosure may include direct connection and indirect connection. In the case of direct connection, there are no components between the terminals. For example, a first terminal of a switch A is connected to a first terminal of a switch B, and on the connection line between the first terminal of the switch A and the first terminal of the switch B, there may be only the connection line (e.g., metal line), without other components. In the case of indirect connection, there may be other components between the terminals. For example, a first terminal of a switch C may be connected to a first terminal of a switch D on the connection line between the first terminal of the switch C and the first terminal of the switch D, there may also be at least one of other components (e.g., a switch E, etc.), in addition to the connection line.

Figure 1:
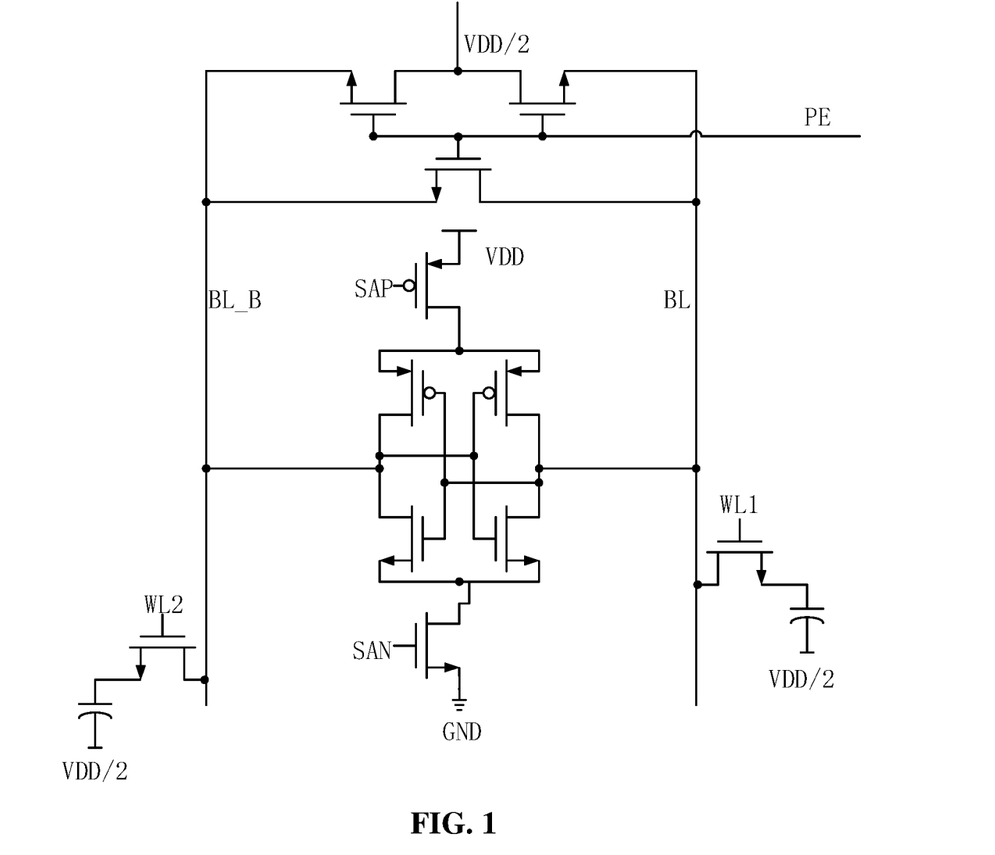
FIG. 1 schematically illustrates a schematic diagram of a sense amplifier according to an embodiment of the disclosure.

FIG. 1 schematically illustrates a schematic diagram of a sense amplifier according to an embodiment of the disclosure.

Referring to FIG. 1, during reading data in a memory cell on a bit line, firstly, the bit line BL and a reference bit line BL_B may be precharged, so that each of the bit line BL and the reference bit line BL_B is precharged to VDD/2. A corresponding word line WL is output after decoding an address. For example, the lowest bit A0 of the row address is at a low level, representing an even address, and the lowest bit A0 of the row address is at a high level, representing an odd address. It may be specified that the decoded even address corresponds to selecting a memory cell connected to the bit line BL, and the decoded odd address corresponds to selecting a memory cell connected to the reference bit line BL_B. Subsequently, the storage voltage is shared charge with the bit lines, and a voltage difference is generated between the bit line BL and the reference bit line BL_B. Then, at the amplification stage, the power supply VDD performs work whether 0 or 1 is read, so that the voltage of the bit line on one side is pulled up to VDD, and the voltage of the bit line on the other side is pulled down to zero by GND. It should be noted that the determination of the even address or the odd address is not limited to be identified by the lowest bit A0 of the row address, or may be identified by other bits in the row address, or may be identified by a result obtained by processing at least one bit in the row address according to a specific relationship, which is not limited in the disclosure and may be set by those skilled in the art as required.

When a read operation is performed on the bit line BL, since the reference bit line BL_B does not perform a write-back operation on the memory cell, the voltage of the reference bit line BL_B does not need to be amplified. That is, the amplified potential of the reference bit line BL_B does not affect the reading of data. Therefore, the connection between the sense amplifier and the reference bit line BL_B may be cut off at the amplification stage to reduce power consumption when the read operation is performed on the bit line BL.

In view of this, the disclosure provides a new sense amplifier.

Figure 2:
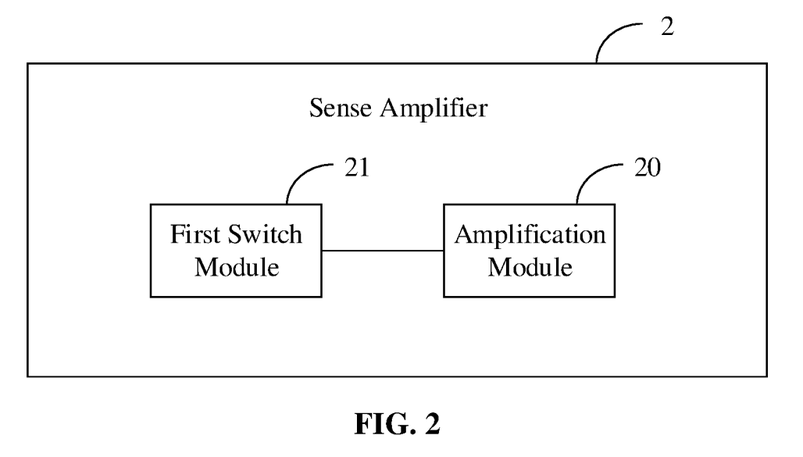
FIG. 2 schematically illustrates a block diagram of a sense amplifier according to an exemplary embodiment of the disclosure.

FIG. 2 schematically illustrates a block diagram of a sense amplifier according to an exemplary embodiment of the disclosure. Referring to FIG. 2, the sense amplifier 2 may include an amplification module 20 and a first switch module 21.

The amplification module 20 may be configured to amplify a voltage transmitted by a bit line or a reference bit line, when the sense amplifier is at an amplification stage.

The first switch module 21 may be configured to control the amplification module 20 to be disconnected from the reference bit line, when the sense amplifier performs a read operation on the bit line and the sense amplifier is at the amplification stage.

Herein, performing the read operation on the bit line includes performing a read '0' operation on the bit line and a read '1' operation on the bit line.

By controlling the amplification module to be disconnected from the reference bit line when the sense amplifier performs a read operation on the bit line and the sense amplifier is at the amplification stage, the power consumption of the sense amplifier may be effectively reduced, and the processing speed of the circuit may be improved.

Specifically, the first switch module 21 may control the amplification module 20 to be disconnected from the reference bit line based on a data source control signal, when the sense amplifier 2 is at the amplification stage.

Herein, the data source control signal indicates whether data in the memory cell on the bit line or data in the memory cell on the reference bit line is read. Generally, the lowest bit A0 of the row address may be used as the data source control signal. For example, the lowest bit A0 of the row address is at a low level, representing an even address, which corresponds to selecting the memory cell on the bit line; and the lowest bit A0 of the row address is at a high level, representing an odd address, which corresponds to selecting the memory cell on the reference bit line. However, it should be noted that the data source control signal described in the disclosure may also be any signal which can identify whether data in the memory cell on the bit line or data in the memory cell on the reference bit line is read, which is not limited in the disclosure.

The first switch module 21 may include a first switch unit.

A first control terminal of the first switch unit is configured to receive the data source control signal. A first terminal of the first switch unit is connected to the amplification module 20 through a first node, and a second terminal of the first switch unit is connected to the reference bit line.

In another embodiment of the disclosure, the first switch unit further includes a second control terminal configured to receive a first control signal. In this case, the first switch module 21 is configured to control the amplification module 20 to be disconnected from the reference bit line in response to the data source control signal and the first control signal.

Figure 3:
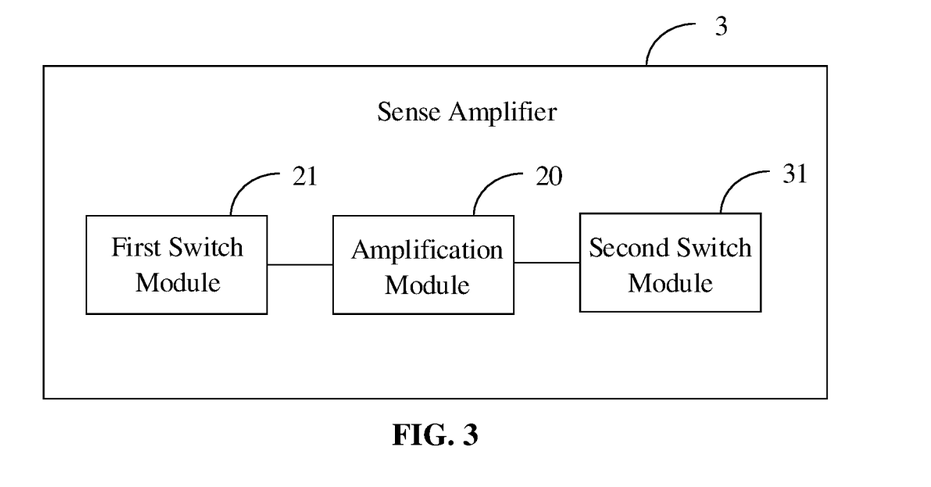
FIG. 3 schematically illustrates a block diagram of a sense amplifier according to another exemplary embodiment of the disclosure.

Referring to FIG. 3, the sense amplifier 3 may include a second switch module 31 in addition to the amplification module 20 and the first switch module 21 as described above. The second switch module 31 may be configured to control the amplification module 20 to be disconnected from the bit line, when the sense amplifier 3 performs a read operation on the reference bit line and the sense amplifier 3 is at the amplification stage.

That is, similar to the first switch module 21, the connection state of the amplification module 20 with the bit line may be controlled by the second switch module 31.

The first switch module is configured to control the amplification module to be disconnected from the bit line, when the sense amplifier performs a read operation on the reference bit line and the sense amplifier is at the amplification stage. Therefore, when the read operation is performed on the reference bit line, the power consumption of the sense amplifier is greatly reduced. Furthermore, since amplification of the voltage on the bit line is not performed in the solution of the disclosure when the read operation is performed on the reference bit line, the signal processing speed of the circuit is improved.

Furthermore, the second switch module 31 may also be configured to write the read signal back to the memory cell, after the sense amplifier performs the read operation on the bit line.

The second switch module 31 may include an inverter and a second switch unit.

Herein, the input terminal of the inverter is configured to receive a data source control signal. A first control terminal of the second switch unit is connected to an output terminal of the inverter, a first terminal of the second switch unit is connected to the amplification module 20 through a second node, and a second terminal of the second switch unit is connected to the bit line.

In another embodiment, the second switch unit further includes a second control terminal configured to receive a first control signal.

In the above exemplary solution of the sense amplifier, if a read '1' operation is performed on the bit line, after the read '1' operation, the voltage of the reference bit line is VDD/2, and the voltage of the bit line is VDD. In this case, the sense amplifier may be affected when the sense amplifier is next precharged, and the sense amplifier may not be precharged to VDD/2.

Figure 4:
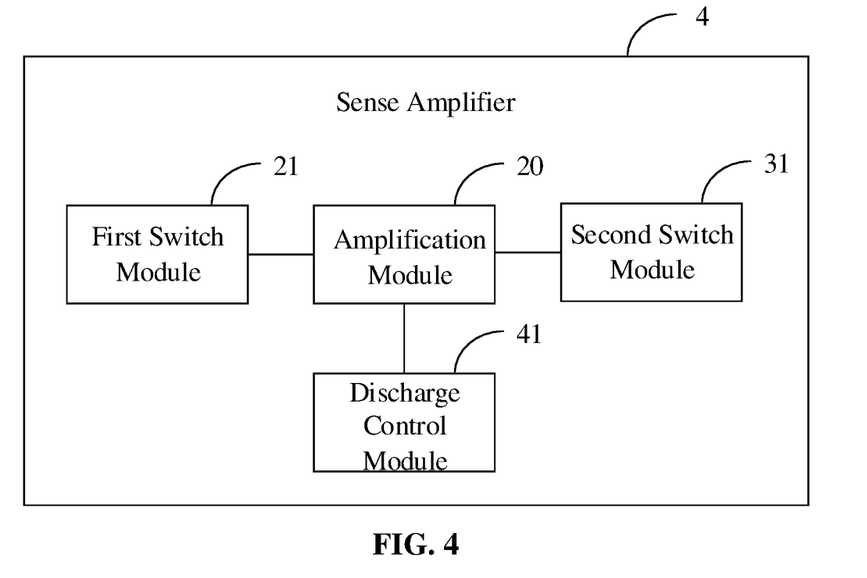
FIG. 4 schematically illustrates a block diagram of a sense amplifier according to yet another exemplary embodiment of the disclosure.

In order to solve the problem, referring to FIG. 4, the sense amplifier 4 may include a discharge control module 41 in addition to the amplification module 20, the first switch module 21 and the second switch module 31 as described above. The discharge control module 41 is configured to discharge the sense amplifier 4 after the sense amplifier 4 performs a read '1' operation on the bit line. Therefore, after the next precharge, each of the voltage of the reference bit line and the voltage of the bit line may be VDD/2.

In an exemplary embodiment of the disclosure, the amplification module 20 may include a first PMOS transistor, a first NMOS transistor, a second PMOS transistor, a second NMOS transistor, a third PMOS transistor and a third NMOS transistor.

Specifically, a drain of the first PMOS transistor is connected to a first node, and a gate of the first PMOS transistor is connected to a second node. A drain of the first NMOS transistor is connected to the first node, and a gate of the first NMOS transistor is connected to the gate of the first PMOS transistor. A drain of the second PMOS transistor is connected to a second node, and a gate of the second PMOS transistor is connected to the first node. A drain of the second NMOS transistor is connected to the second node, and a gate of the second NMOS transistor is connected to the gate of the second PMOS transistor. A drain of the third PMOS transistor is connected to a source of the first PMOS transistor and a source of the second PMOS transistor, a gate of the third PMOS transistor is configured to receive a second control signal, and a source of the third PMOS transistor is configured to receive a supply voltage. A drain of the third NMOS transistor is connected to a source of the first NMOS transistor and a source of the second NMOS transistor, a gate of the third NMOS transistor is configured to receive a first control signal, and a source of the third NMOS transistor is grounded.

According to an embodiment of the disclosure, the first switch unit may include a fourth NMOS transistor. A gate of the fourth NMOS transistor is configured to receive the data source control signal, a source of the fourth NMOS transistor is connected to the reference bit line, and a drain of the fourth NMOS transistor is connected to the first node.

According to another embodiment of the disclosure, the first switch unit may include a fourth PMOS transistor in addition to the fourth NMOS transistor. Herein, a gate of the fourth PMOS transistor is configured to receive the first control signal, a drain of the fourth PMOS transistor is connected to the reference bit line, and a source of the fourth PMOS transistor is connected to the first node.

According to an embodiment of the disclosure, the second switch unit may include a fifth NMOS transistor. A gate of the fifth NMOS transistor is connected to the output terminal of the inverter, a drain of the fifth NMOS transistor is connected to the bit line, and a source of the fifth NMOS transistor is connected to the second node.

According to another embodiment of the disclosure, the second switch unit may include a fifth PMOS transistor in addition to the fifth NMOS transistor. Herein, a gate of the fifth PMOS transistor is configured to receive the first control signal, a source of the fifth PMOS transistor is connected to the bit line, and a drain of the fifth PMOS transistor is connected to the second node.

Furthermore, the discharge control module 41 may include a first discharge unit and a second discharge unit.

Specifically, the first discharge unit may be configured to connect the gate of the first NMOS transistor to the first node in response to a discharge control signal, so that the first NMOS transistor is formed in a diode connection. The second discharge unit may be configured to connect the gate of the second NMOS transistor to the second node in response to a discharge control signal, so that the second NMOS transistor is formed in a diode connection.

It should be noted that the sense amplifiers with various configurations as described above may further include a precharge module. The precharge module is configured to precharge the bit line and the reference bit line when the sense amplifier is at a precharge stage.

Figure 5:
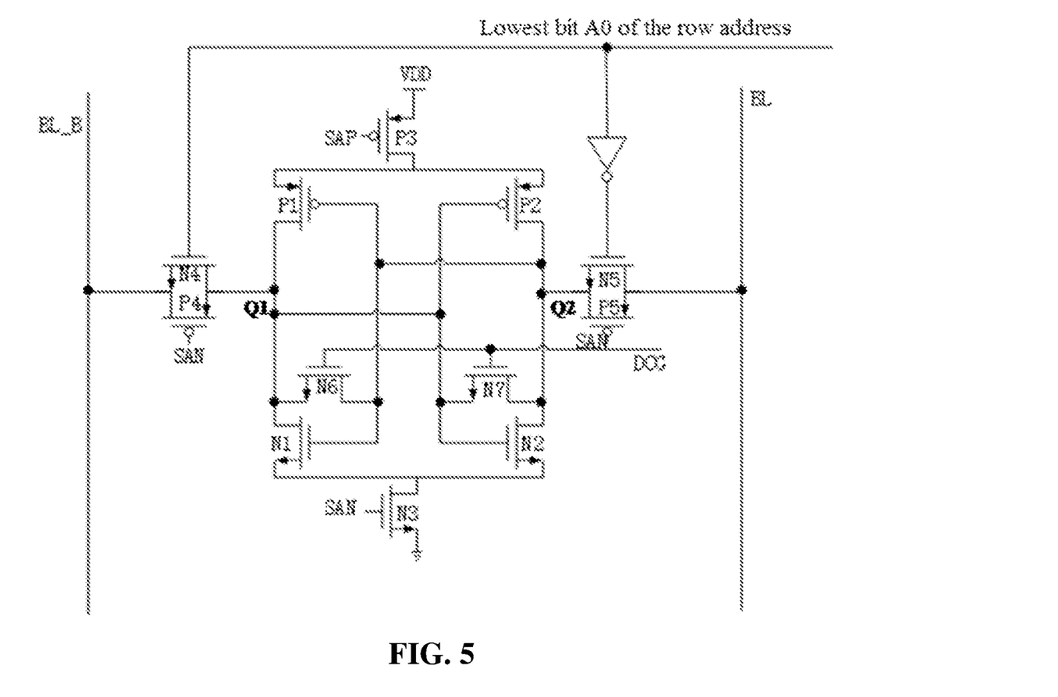
FIG. 5 schematically illustrates a circuit diagram of a sense amplifier according to an exemplary embodiment of the disclosure.

FIG. 5 schematically illustrates a circuit diagram of a sense amplifier according to an exemplary embodiment of the disclosure.

In the embodiment illustrated in FIG. 5, the bit line is denoted as BL, the reference bit line is denoted as BL_B, the first node is denoted as Q1, and the second node is denoted as Q2.

The first PMOS transistor is denoted as P1, the first NMOS transistor is denoted as N1, the second PMOS transistor is denoted as P2, the second NMOS transistor is denoted as N2, the third PMOS transistor is denoted as P3, the third NMOS transistor is denoted as N3, the fourth PMOS transistor is denoted as P4, the fourth NMOS transistor is denoted as N4, the fifth PMOS transistor is denoted as P5, and the fifth NMOS transistor is denoted as N5. Furthermore, the first control signal is denoted as a signal SAN, and the second control signal is denoted as a signal SAP.

The first discharge unit is configured as an NMOS transistor N6, and the second discharge unit is configured as an NMOS transistor N7. Furthermore, the discharge control signal is denoted as a signal DCG.

Although it is not depicted in FIG. 5, it is readily understood by those skilled in the art that each of the bit line BL and the reference bit line BL_B is connected to a memory cell. The memory cell may be composed of, for example, an NMOS transistor and a capacitor, and controls the on-state of the transistor based on the control signal on the word line (WL), so as to read or write data stored in the capacitor.

Furthermore, although the precharge module is not depicted in FIG. 5, it may be seen by those skilled in the art based on the circuit illustrated in FIG. 1 that the precharge module according to the exemplary embodiment of the disclosure may include three NMOS transistors, and it is determined by the precharge module whether to perform a precharge operation on the bit line BL and the reference bit line BL_B according to the precharge control signal PE.

In the example illustrated in FIG. 5, the lowest bit A0 of the row address is configured as the data source control signal.

It should be understood that the configuration of the components in the circuit illustrated in FIG. 5 is merely an exemplary depiction, in which the components with switching functions may be configured as NMOS transistors, PMOS transistors or transmission gates, which is not limited in the disclosure.

The operations of reading the bit line by the sense amplifier according to the exemplary embodiment of the disclosure may include a precharge stage, an induction stage, an amplification stage and a discharge stage.

Figure 6:
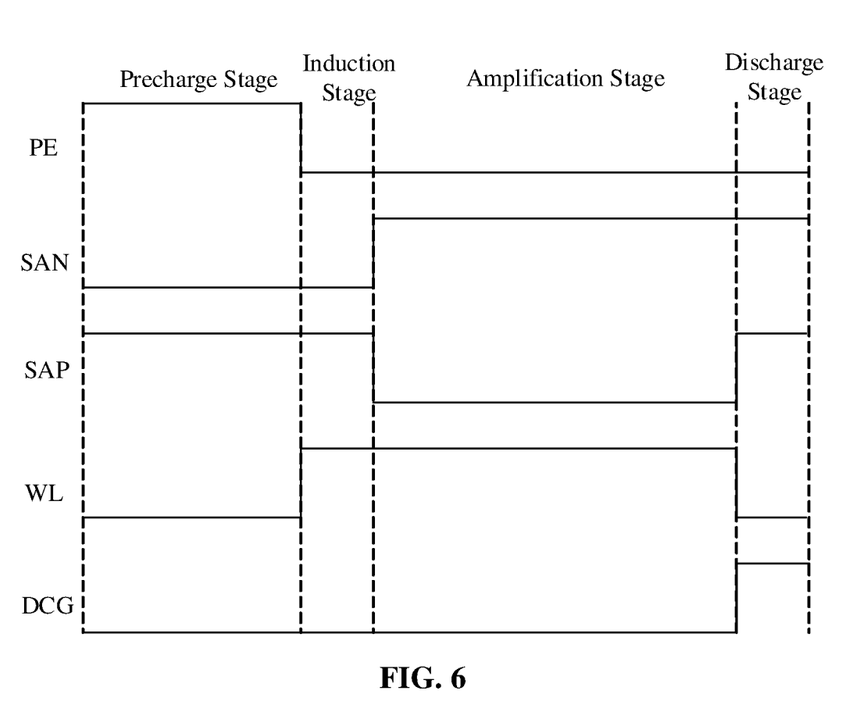
FIG. 6 schematically illustrates a timing diagram of operations of a sense amplifier according to an exemplary embodiment of the disclosure.

FIG. 6 schematically illustrates a timing diagram of operations of a sense amplifier according to an exemplary embodiment of the disclosure. The operation of the sense amplifier illustrated in FIG. 5 will be described below with reference to the timing diagram of FIG. 6, with an example that the memory cell on the bit line BL is selected when the lowest bit A0 of the row address is at a low level.

At the precharge stage, the precharge control signal PE is at a high level, and the precharge module starts to operate to precharge the bit line BL and the reference bit line BL_B, so that each of the voltage on the bit line BL and the voltage on the reference bit line BL_B is precharged to VDD/2.

Furthermore, the first control signal SAN is at a low level, and the transistor P4 and the transistor P5 are turned on. In this case, each of the first node Q1 and the second node Q2 is precharged to VDD/2.

At the induction stage, the word line WL is at a high level, the memory cell is selected, and the voltage in the memory cell is transmitted to the amplification module for sharing charge with at least one of the first node Q1 or the second node Q2.

At the amplification stage, the transistor N4 is turned off. Since the first control signal SAN is at a high level, the transistor P4 is also turned off. Therefore, the sense amplifier is disconnected from the reference bit line BL_B at the amplification stage.

Furthermore, the first control signal SAN is at the high level, the second control signal SAP is at a low level, the transistor N3 and the transistor P3 are turned on, and the voltages of the first node Q1 and the second node Q2 are amplified. Considering that the transistor N5 is in an on-state, the amplified voltage of the second node Q2 is written back to the memory cell on the bit line BL through the transistor N5.

At the discharge stage, the discharge control signal DCG is at a high level, the transistor N6 and the transistor N7 are turned on, each of the first control signal SAN and the second control signal SAP is at a high level, the transistor P3 is turned off, and the transistor N3 is turned on. Therefore, the transistor N1 and the transistor N2 are configured to be diode-connected, and discharge is performed through the transistor N1 and the transistor N2 to ensure that the bit line BL and the reference bit line BL_B may be precharged and balanced to VDD/2 during the next precharge.

Although it is described above as an example that the memory cell on the bit line BL is selected when the lowest bit A0 of the row address is at a low level, those skilled in the art may conceive of other implementations included in the disclosure based on the exemplary solution of the disclosure.

It should be understood that in the above description, the sense amplifier according to the exemplary embodiment of the disclosure is described with an example of controlling the amplification module to be disconnected from the reference bit line when the sense amplifier performs the read operation on the bit line and the sense amplifier is at the amplification stage. However, as mentioned above, based on the sense amplifier according to the exemplary embodiment of the disclosure, it is also possible to control the amplification module to be disconnected from the bit line when the sense amplifier performs the read operation on the reference bit line and the sense amplifier is at the amplification stage. As a result, the power consumption of the sense amplifier is greatly reduced, and the signal processing speed of the circuit is improved.

Further, the disclosure also provides a method for controlling a sense amplifier. Specifically, the method includes the following operation. The amplification module is controlled to be disconnected from a reference bit line, when the sense amplifier performs a read operation on a bit line and the sense amplifier is at an amplification stage.

Furthermore, the method for controlling the sense amplifier may further include the following operation. The amplification module is controlled to be disconnected from a bit line, when the sense amplifier performs a read operation on a reference bit line and the sense amplifier is at an amplification stage.

The method for controlling the sense amplifier according to the exemplary embodiment of the disclosure is suitable for the sense amplifier as described above, and the implementation of the method has been described in the above description of the sense amplifier, which is not repeated herein.

With the method for controlling the sense amplifier in the disclosure, the power consumption of the sense amplifier may be effectively reduced, and the speed of the circuit may be improved.

Further, the disclosure also provides a memory, which includes the sense amplifier described above.

Other embodiments of the disclosure will be apparent to those skilled in the art from consideration of the specification and practice of the disclosure disclosed here. The disclosure is intended to cover any variations, uses, or adaptations of the disclosure following the general principles thereof, and including such departures from the disclosure as come within known or customary practice in the art. It is intended that the specification and embodiments are considered as exemplary only, with a true scope and spirit of the disclosure being indicated by the following claims.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

The invention claimed is:

1. A sense amplifier, comprising:
an amplification circuit configured to amplify a voltage transmitted by a bit line or a reference bit line, when the sense amplifier is at an amplification stage;
a first switch circuit configured to control the amplification circuit to be disconnected from the reference bit line, when the sense amplifier performs a read operation on the bit line and the sense amplifier is at the amplification stage; and
a discharge control circuit configured to discharge the sense amplifier after the sense amplifier performs a read '1' operation on the bit line.

2. The sense amplifier of claim 1, wherein the first switch circuit is configured to control the amplification circuit to be disconnected from the reference bit line based on a data source control signal, when the sense amplifier is at the amplification stage.

3. The sense amplifier of claim 2, wherein the first switch circuit comprises:
   a first switch assembly, a first control terminal of the first switch assembly being configured to receive the data source control signal, a first terminal of the first switch assembly being connected to the amplification circuit through a first node, and a second terminal of the first switch assembly being connected to the reference bit line.

4. The sense amplifier of claim 3, wherein the first switch circuit configured to control the amplification circuit to be disconnected from the reference bit line based on the data source control signal is configured to:
   control the amplification circuit to be disconnected from the reference bit line in response to the data source control signal and a first control signal; and
   wherein the first switch assembly further comprises a second control terminal configured to receive the first control signal.

5. The sense amplifier of claim 4, wherein the first switch assembly comprises:
   a fourth negative channel Metal Oxide Semiconductor (NMOS) transistor, a gate of the fourth NMOS transistor being configured to receive the data source control signal, a source of the fourth NMOS transistor being connected to the reference bit line, and a drain of the fourth NMOS transistor being connected to the first node; and
   a fourth positive channel Metal Oxide Semiconductor (PMOS) transistor, a gate of the fourth PMOS transistor being configured to receive the first control signal, a drain of the fourth PMOS transistor being connected to the reference bit line, and a source of the fourth PMOS transistor being connected to the first node.

6. The sense amplifier of claim 3, wherein the first switch assembly comprises:
   a fourth negative channel Metal Oxide Semiconductor (NMOS) transistor, a gate of the fourth NMOS transistor being configured to receive the data source control signal, a source of the fourth NMOS transistor being connected to the reference bit line, and a drain of the fourth NMOS transistor being connected to the first node.

7. The sense amplifier of claim 1, wherein the sense amplifier further comprises:
   a second switch circuit configured to control the amplification circuit to be disconnected from the bit line, when the sense amplifier performs a read operation on the reference bit line and the sense amplifier is at the amplification stage.

8. The sense amplifier of claim 7, wherein the second switch circuit comprises:
   an inverter, an input terminal of the inverter being configured to receive a data source control signal; and
   a second switch assembly, a first control terminal of the second switch assembly being connected to an output terminal of the inverter, a first terminal of the second switch assembly being connected to the amplification circuit through a second node, and a second terminal of the second switch assembly being connected to the bit line.

9. The sense amplifier of claim 8, wherein the second switch assembly further comprises:
   a second control terminal configured to receive a first control signal.

10. The sense amplifier of claim 9, wherein the second switch assembly comprises:
    a fifth negative channel Metal Oxide Semiconductor (NMOS) transistor, a gate of the fifth NMOS transistor being connected to the output terminal of the inverter, a drain of the fifth NMOS transistor being connected to the bit line, and a source of the fifth NMOS transistor being connected to the second node; and
    a fifth positive channel Metal Oxide Semiconductor (PMOS) transistor, a gate of the fifth PMOS transistor being configured to receive the first control signal, a source of the fifth PMOS transistor being connected to the bit line, and a drain of the fifth PMOS transistor being connected to the second node.

11. The sense amplifier of claim 8, wherein the second switch assembly comprises:
    a fifth negative channel Metal Oxide Semiconductor (NMOS) transistor, a gate of the fifth NMOS transistor being connected to the output terminal of the inverter, a drain of the fifth NMOS transistor being connected to the bit line, and a source of the fifth NMOS transistor being connected to the second node.

12. The sense amplifier of claim 1, wherein the amplification circuit comprises:
    a first positive channel Metal Oxide Semiconductor (PMOS) transistor, a drain of the first PMOS transistor being connected to a first node;
    a first negative channel Metal Oxide Semiconductor (NMOS) transistor, a drain of the first NMOS transistor being connected to the first node, and a gate of the first NMOS transistor being connected to a gate of the first PMOS transistor;
    a second PMOS transistor, a drain of the second PMOS transistor being connected to a second node;
    a second NMOS transistor, a drain of the second NMOS transistor being connected to the second node, and a gate of the second NMOS transistor being connected to a gate of the second PMOS transistor;
    a third PMOS transistor, a drain of the third PMOS transistor being connected to a source of the first PMOS transistor and a source of the second PMOS transistor, a gate of the third PMOS transistor being configured to receive a second control signal, and a source of the third PMOS transistor being configured to receive a supply voltage; and
    a third NMOS transistor, a drain of the third NMOS transistor being connected to a source of the first NMOS transistor and a source of the second NMOS transistor, a gate of the third NMOS transistor being configured to receive a first control signal, and a source of the third NMOS transistor being grounded;
    wherein the gate of the first PMOS transistor is connected to the second node, and the gate of the second PMOS transistor is connected to the first node.

13. The sense amplifier of claim 12, wherein the discharge control circuit comprises:
    a first discharge assembly configured to connect the gate of the first NMOS transistor to the first node in response to a discharge control signal; and
    a second discharge assembly configured to connect the gate of the second NMOS transistor to the second node in response to the discharge control signal.

14. The sense amplifier of claim 1, further comprising:
a precharge circuit configured to precharge the bit line and the reference bit line when the sense amplifier is at a precharge stage.

15. A memory, comprising a sense amplifier, wherein the sense amplifier comprises:
an amplification circuit configured to amplify a voltage transmitted by a bit line or a reference bit line, when the sense amplifier is at an amplification stage;
a first switch circuit configured to control the amplification circuit to be disconnected from the reference bit line, when the sense amplifier performs a read operation on the bit line and the sense amplifier is at the amplification stage; and
a discharge control circuit configured to discharge the sense amplifier after the sense amplifier performs a read '1' operation on the bit line.

16. The memory of claim 15, wherein the first switch circuit is configured to control the amplification circuit to be disconnected from the reference bit line based on a data source control signal, when the sense amplifier is at the amplification stage.

17. The memory of claim 16, wherein the first switch circuit comprises:
a first switch assembly, a first control terminal of the first switch assembly being configured to receive the data source control signal, a first terminal of the first switch assembly being connected to the amplification circuit through a first node, and a second terminal of the first switch assembly being connected to the reference bit line.

18. The memory of claim 17, wherein the first switch circuit configured to control the amplification circuit to be disconnected from the reference bit line based on the data source control signal is configured to:
control the amplification circuit to be disconnected from the reference bit line in response to the data source control signal and a first control signal; and
wherein the first switch assembly further comprises a second control terminal configured to receive the first control signal.

19. A method for controlling a sense amplifier, comprising:
controlling an amplification circuit to be disconnected from a reference bit line, when the sense amplifier performs a read operation on a bit line and is at an amplification stage; and
discharging the sense amplifier after the sense amplifier performs a read '1' operation on the bit line.

* * * * *